United States Patent [19]
Chu

[11] Patent Number: 5,350,961
[45] Date of Patent: Sep. 27, 1994

[54] ACOUSTIC WAVE DEVICES FOR CONTROLLING HIGH FREQUENCY SIGNALS

[75] Inventor: David K. Chu, Wilmington, Del.

[73] Assignee: E. I. Du Pont de Nemours and Company, Wilmington, Del.

[21] Appl. No.: 924,691

[22] Filed: Jul. 31, 1992

[51] Int. Cl.$^5$ .................... H01L 41/04; H01L 41/193
[52] U.S. Cl. .......................... 310/313 A; 310/313 B; 310/334; 310/358
[58] Field of Search ........... 310/313 R, 313 A, 313 B, 310/334, 358, 360; 333/150, 154

[56] References Cited

U.S. PATENT DOCUMENTS

| | | | |
|---|---|---|---|
| 3,568,079 | 3/1971 | Yoder | 333/150 |
| 3,924,145 | 12/1975 | Kansy | 310/313 A |
| 4,037,175 | 7/1977 | Kansy et al. | 310/313 A |
| 4,109,359 | 8/1978 | Cross et al. | 310/360 |
| 4,231,838 | 11/1980 | Gier | 156/600 |
| 4,255,726 | 3/1981 | Kinoshita et al. | 333/195 |

(List continued on next page.)

FOREIGN PATENT DOCUMENTS

0454071A2  4/1991  European Pat. Off.

OTHER PUBLICATIONS

Patent Abstracts of Japan, vol. 013, No. 421 (E-822) Sep. 19, 1989 pertaining to JP, A, 11 57 582 (Hiroshi Shimizu), Jun. 20, 1989.

Patent Abstracts of Japan, vol. 015, No. 172 (P-1197) Apr. 30, 1991 pertaining to JP, A, 30 37 574 (Ricoh), Feb. 18, 1991.

Tourlog et al., Japanese Journal of Applied Physics, vol. 30, (1991) Supplement 30-1, pp. 159-161.

Murota et al., Japanese Journal of Applied Physics, vol. 30, (1991) Supplement 30-1, pp. 143-145.

Jeffrey L. Bleustein, *Applied Physic Letters*, vol. 13, No. 12, Dec. 15, 1968.

White et al., Applied Physics Letter, vol. 7, No. 12, pp. 314-316, Dec. 15, 1965; "Direct Piezoelectric Coupling to Surface Elastic Waves".

Buritskii et al., Sov. Tech. Phys. Lett. 17(8), Aug. 1991, 563-565 "Planar acousto-optic modulator using a Rb:kTP waveguide".

Kuhn et al., Applied Physics Letter, vol. 17, No. 6, Sep. 15, 1970, pp. 265-267; "Deflection of an Optical Guided Wave by a Surface Acoustic Wave".

Wagers et al., IEEE Transactions on Sonics and Ultrasonics, vol. SU-31, No. 3, May 1988, pp. 168-174; "Residual Bulk Mode Levels in (YXI) 128° LiNbO$_3$".

Tseng, Applied Physics Letter, vol. 16, No. 6, Mar. 15, 1970, pp. 253-255.

Lewis et al., 1977 Utrasonics Symposium Proceedings IEEE CAT#77CH1264-1SU, pp. 744-752, "Surface Skimming Bulk Waves, SSBW".

Buritskii et al., Electronics Letters, Oct. 10, 1991, vol. 27, No. 21, p. 1896; "Waves in Rb:KtP".

Roshchupkin et al., Appl. Phys. Lett. 60(19), pp.

(List continued on next page.)

*Primary Examiner*—Thomas M. Dougherty

[57] ABSTRACT

Devices are disclosed for controlling high frequency signals such as optic or electric signals by the generation of acoustic waves. The devices use certain bulk or surface-modified crystalline substrates which have a surface with a receiving area and an input interdigital transducer deposited on the signal receiving area of the substrate surface which is suitable for connection to a source of signal and for inverse piezoelectrically generating acoustic waves in the crystalline substrate. The crystal substrates are of a material having a piezoelectric-elastic dielectric matrix capable of the generation of acoustic waves and for bulk substrates, are of MTiOXO$_4$ (where M is K, Rb, Tl, and/or NH$_4$ and X is P and/or As) having mm2 symmetry. The receiving area of the surface-modified crystal substrates has alternating sections of crystalline material which are aligned and have a ferroelectric domain structure opposite to that of adjacent sections, and the IDT for said substrates is in contact with said alternating sections.

10 Claims, 3 Drawing Sheets

U.S. PATENT DOCUMENTS

| | | | |
|---|---|---|---|
| 4,568,848 | 2/1986 | Ogawa | 310/313 B |
| 5,066,356 | 11/1991 | Ferretti et al. | 156/623 R |
| 5,164,947 | 11/1992 | Lukas et al. | 372/22 |
| 5,175,741 | 12/1992 | Okazaki | 372/75 |
| 5,224,195 | 6/1993 | Yoshida et al. | 385/122 |

OTHER PUBLICATIONS

2330–2331, May 11, 1992; "Scanning electron microscopy observation of excitation of the surface acoustic wave . . . ".

Janzen et al., Proceedings of Integrated Photonics Research, TUD5-2, pp. 164–165, (1992), "Electric field induced ferroelectric microdomain inversion on x and y-cut lithium niobate".

Chu, Dissertation, pp. 57–64, University of Delaware (1991).

Smith, Acoustic Surface Waves, Fabrication Techniques for Surface Wave Devices, pp. 305–324, Springer-Verlag, Berlin Heidelberg, N.Y. (1978).

Adler, McGill University, IEEE Transactions on Ultrasonics, Ferroelectrics, and Frequency Control, vol. 37, No. 6, pp. 485–490, (Nov. 1990).

Yariv et al., Optical Waves in Crystals, John Wiley and Sons, New York, 1984, pp. 318–365.

Elliott et al., Surface Acoustic Wave Devices: Design and Measurement, RF & Microwave Measurement Symposium and Exhibition, Hewlett Packard.

Hunsperger, Integrated Optics: Theory and Technology, Third Edition, Springer-Verlag, Berlin Heidelberg, N.Y.

Bray et al., Time-Domain Characterizations of Saw Devices, RF & Microwave Measurement Symposium and Exhibition.

Hartmann et al., IEEE Transactions on Sonics and Ultrasonics, vol. 2U-20, No. 2, Apr. 1973, pp. 80–93.

Toda et al., IEEE Transactions on Sonics and Ultrasonics, vol. SU-22, No. 1, Jan. 1975, pp. 39–45.

Smith et al., IEEE Transactions on Microwave Theory and Techniques, vol. MTT-20, No. 7, Jul. 1972, pp. 458–471.

Nabeyama et al., IEEE Transactions on Consumer Electronics, vol. CE-25, Feb. 1979, pp. 50–59.

Kishimoto et al., Saw Comb Filter For TV Frequency Synthesizing Tuning System, 1980 Ultrasonics Symposium, pp. 377–381.

Yamada et al., IEEE Transactions on Consumer Electronics, vol. CE-28, No. 3, Aug. 1982, pp. 192–195.

Duquesnov et al., 2.2 GHz SH-Mode Saw Delay Line, 1982 Ultrasonics Symosium, pp. 57–62.

Lewis et al., GHz Saw Transducers with Improved Lithographic Tolerance, 1982 Ultransonics Symposium, pp. 63–66.

ACOUSTIC WAVE DEVICES FOR CONTROLLING HIGH FREQUENCY SIGNALS

FIELD OF THE INVENTION

This invention relates to acoustic wave devices employing crystalline materials, and more particularly to the use of crystalline materials having piezoelectric properties such as KTiOPO$_4$ in acoustic wave devices.

BACKGROUND OF THE INVENTION

Surface acoustic waves (i.e., "SAWS"), also known as Rayleigh waves, have been known since the middle of the nineteenth century. However, it was not until much later that the phenomenon of SAW propagation was first exploited for its applications to electronic devices. Acoustic wave devices known in the art commonly consist of a substrate on which a conductive material is deposited in a predetermined pattern. The patterned conductive material is known as an interdigital transducer (i.e., an IDT). R. M. White et al., Appl. Phys. Let., Volume 7, Number 12, pages 314–316 (Dec. 15, 1965), describes the use of the IDT as an efficient technique for the generation and detection of surface acoustic waves on a piezoelectric surface. An IDT may be suitably connected to an electrical input so that the refractive index in a crystal is changed as required by acoustic-optic applications. See, e.g., K. S. Buritskii et al., Soy. Tech Phys. Lett. 17(8) pp. 563–565 (1991) and L. Kunn et al., Appl. Phys. Lett, 17(6) pp. 265–267 (1970). In other applications, an IDT on one end of a substrate surface may be connected to a source of the frequency waves (e.g., television antenna—radio frequency) and an IDT on the other end of the substrate surface may be connected to a device designed to receive a predetermined frequency (e.g., radio frequency for a specific television channel). The design of the IDT (i.e., the pattern of the conductive materials on the surface of a particular type of substrate) determines how the frequency will be controlled (e.g., which channel is received).

The types of acoustic waves which may be generated in a given crystal depend upon the piezoelectric-elastic-dielectric (i.e., PED) matrix of the crystal, which in turn depends on the crystal structure. In other words, not all materials are suitable for SAW generation, and materials which are suitable for SAW generation may not be suitable for generation of other types of acoustic waves. The properties of the substrate (e.g., the crystal structure) will determine the type of acoustic wave that will be generated, mechanism of the control and how high a frequency can be controlled.

Radio frequency control devices using substrates capable of controlling the received radio frequency by the generation of SAWs are known in the art. For example, R. S. Wagers et al., IEEE Transactions on Sonics and Ultrasonics, Vol SU-31, No. 3, pages 168–174 (May 1984) discloses SAW devices based on lithium niobate. In these SAW devices the SAWs, generated by an IDT connected to a source of radio frequency waves, propagate through a y-cut lithium niobate crystal at a rate of about 3500 meters per second. This permits these SAW devices to be useful as radio frequency controllers in, for example, conventional television.

Acoustic waves, other than SAWs, may be generated in bulk crystal. For example, the Bleustein-Gulyaev wave (i.e., B-G wave) has been both mathematically postulated and experimentally proven to exist in crystals having 6 mm or mm2 crystal symmetries (see e.g., J. L. Bleustein, Appl. Phys. Lett., Volume 13, Number 12, pages 412–413 (Dec. 15, 1968), and C.-C. Tseng, Appl. Phys. Lett. Volume 16, Number 6, pages 253–255 (Mar. 15, 1970)); and surface skimming bulk waves (i.e., SSBWs) have been shown to propagate on the surface of the crystal and to gradually propagate partially into the depths of the crystal. Such waves (both SSBWs and B-G waves) generally propagate faster than conventional surface acoustic waves. SSBWs have been generated in lithium tantalate and lithium niobate at a rate of about 4100 meters per second and about 5100 meters per second, respectively (see Meirion Lewis et al., 1977 Ultrasonics Symposium Proceedings IEEE Cat#77CH1264-1SU pages 744–752). B-G waves have been found in Bi$_{12}$GeO$_{29}$ (i.e., "BGO") and Ba$_2$NaNb$_5$O$_{15}$ (i.e., "BNN") to possess velocities of 1694 m/sec and 3627 m/sec, respectively (see C.-C. Tseng, Appl. Phys. Lett. Volume 16, Number 6, pages 253–255 (Mar. 15, 1970)).

Since potassium titanyl phosphate (i.e., "KTP") crystals are widely known to have a high nonlinear optical coefficients and resistance to optical damage, the SAW properties of rubidium exchanged KTP have been investigated relative to use in acousto-optic devices. K. S. Buritskii et al., Electronics Letters, Vol. 27, No. 21, pages 1896–1897 (Oct. 10, 1991), discusses the excitation of SAWs in Rb:KTP (i.e., a slab waveguide formed by Rb ion exchange on the surface of a single crystal of KTP). The velocity of the SAW generated in this waveguide was about 3900 meters per second. Buritskii et al., Soy. Tech. Phys. Lett., Volume 17, Number 8, pages 563–565 (August 1991) discusses the fabrication of a planar acousto-optic modulator using a Rb:KTP waveguide.

The effect of domain structure on SAW generation has been studied and reported in D. V. Roshchupkin et al., Appl. Phys. Lett 60(19), pages 2330–2331 (May 11, 1992). This publication discloses utilizing regularly domain reversed lithium niobate, where the domains were reversed by thermoelectrical treatment; and reports that the SAW wavelength is determined by the period of the regular domain structure. Reportedly, the regular domain structure of lithium niobate is more effective for the excitation of SAWs than the ordinary IDT, because the maximum amplitude of the high frequency input signal is determined by the thickness of the sample and not by the period of the IDT.

The number of devices requiring frequency control has grown in number and complexity, and the demand for controlling higher frequencies, such as those needed for microwave generators and high definition television, has grown commensurately.

SUMMARY OF THE INVENTION

This invention provides devices for controlling high frequency signals by the generation of acoustic waves which comprise an IDT in combination with a bulk crystalline substrate of MTiOXO$_4$, wherein M is selected from the group consisting of K, Rb, Tl, NH$_4$ and mixtures thereof and X is selected from the group consisting of P, As, and mixtures thereof, wherein the crystalline substrate of MTiOXO$_4$ (e.g., KTP) has mm2 crystal symmetry. This invention further provides devices for controlling high frequency signals by the generation of acoustic waves which comprise an IDT in combination with a surface-modified crystalline substrate having a PED matrix capable of the generation of acoustic waves and a surface with an area of alternating sections of crystalline material (e.g., alternating sections of KTP and KTP exchanged using rubidium and thalium together with barium) which are aligned and have a ferroelectric domain structure opposite to that of adjacent sections.

More particularly, this invention provides devices for controlling high frequency signals by the generation of acoustic waves (e.g., SAWs having a velocity about 4000 m/sec on an untreated z-cut bulk crystalline MTiOXO$_4$ and B-G waves having a velocity of about 4100 meters per second on an untreated y-cut bulk crystalline MTiOXO$_4$) comprising (a) either said bulk crystalline substrate of MTiOXO$_4$ or said surface-modified crystalline substrate, said substrate having a surface with a receiving area; and (b) an input interdigital transducer deposited on the signal receiving area of said substrate surface, suitable for connection to a source of electric signal and for inverse piezoelectrically generating acoustic waves (e.g., SAWs or B-G waves) in the substrate. For controlling high frequency electrical signals, the substrate surface has a sending area and the device typically includes a second interdigital transducer deposited on the signal sending area of said substrate surface suitable for piezoelectrically detecting said acoustic waves and for connecting the second interdigital transducer to an electric signal responsive device.

Where said bulk crystalline substrate of MTiOXO$_4$ is used for SAW generation, said input IDT material should be deposited on the signal receiving area such that SAWs are generated in the x or y direction in said substrate; and where the bulk crystalline substrate of MTiOXO$_4$ is used for B-G wave generation said input IDT should be deposited on the signal receiving area such that B-G waves are generated in the z direction. Where said surface-modified crystalline substrate is used for controlling high frequency electric signals, the receiving area of the substrate surface has said alternating sections and the input IDT is deposited in contact therewith and the sending area has said alternating sections and the second IDT is deposited in contact therewith.

DETAILED DESCRIPTION

Figure 1:
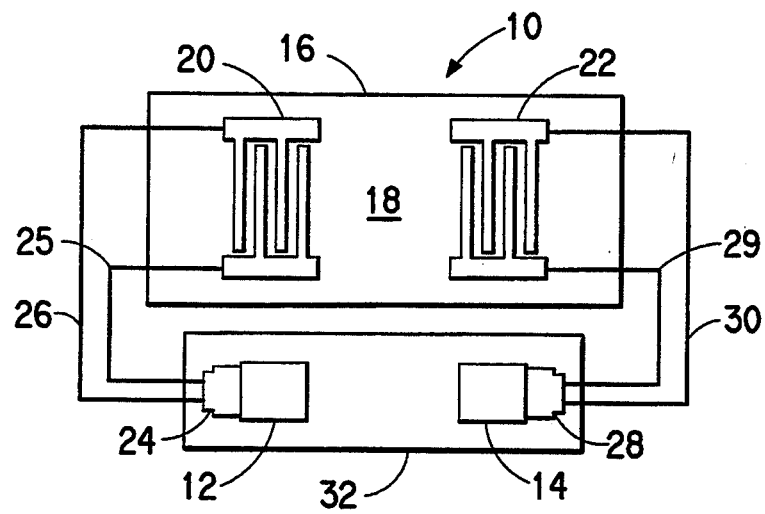
FIG. 1 is a schematic drawing of a frequency controlling device in accordance with the invention bulk crystalline MTiOXO$_4$.

A crystalline substrate of MTiOXO$_4$ (where M is K, Rb, Tl and/or NH$_4$, and X is P and/or As) suitable for use in the practice of this invention may be prepared in the mm2 crystal symmetry by a variety of methods well known in the art. Two fundamental methods are commonly used; one, known as the hydrothermal method (see, e.g., U.S. Pat. No. 5,066,356) and the other, known as the flux method (see, e.g., U.S. Pat. No. 4,231,838). Of the many MTiOXO$_4$ analogues, KTiOPO$_4$ is preferred. The crystalline substrate can be in the form of a single crystal or crystalline thin film, so long as the crystal symmetry is mm2. In use the crystalline substrate can be cut along the x-, y- or z-axis. All rotated cuts will work for the generation of SAW or SSBAW except x- and y-principle cut, but crystals cut along the x- or y-axis are used for the generation of Bleustein-Gulyaev waves. Bulk crystalline substrates at MTiOXO$_4$ such as KTP may be used for generating acoustic waves having a wavelength equal to that of the period of IDT used for acoustic wave generation.

Surface-modified crystalline substrate having periodic domain reversals may be used for generating acoustic waves having a wavelength equal to about one-half of the period of the IDT used for acoustic wave generation. Where said surface-modified crystalline material is used, the domain reversed area corresponds with the area on which an IDT is deposited; said input IDT is preferably deposited on the alternating sections of crystalline material having the same ferroelectric domain structure; the second IDT, when used, is preferably deposited on a signal sending area such that it is deposited on the alternating sections of crystalline material having the same ferroelectric domain structure; and the period of the alternating domains preferably correspond to the period of the IDT(s).

Periodically domain reversed MTiOXO$_4$ can be prepared by masking and ion exchanging adjacent sections of the surface of the MTiOXO$_4$ crystalline material in accordance with the teachings European Patent Application Publication No. 0 454 071 A2. For example, a substrate of the formula MTiOXO$_4$ may be periodically exchanged using at least one of Rb$^+$, Tl$^+$, and Cs$^+$ (preferably Rb$^+$ and/or Tl$^+$) together with at least one of Ba$^{++}$, Sr$^{++}$, and Ca$^{++}$ (preferably Ba$^{++}$). Any crystalline material capable of periodic domain reversal and having a PED matrix capable of the generation of acoustic waves can be used in the practice of this invention. Periodically domain reversed MTiOXO$_4$ and lithium niobate are preferred for overall properties and availability. Periodically domain reversed z-cut lithium niobate can be prepared by conventional thermoelectric treatment as described by D. V. Roshchupkin et al. , Appl. Phys. Lett 60 (19), pages 2330–2331 (May 11, 1992). For y-cut (or x-cut) lithium niobate can be prepared by a similar method described by G. Janzen, et al., Proceedings of Integrated Photonics Research, TuD5-1, Pages 164–165 (1992).

The types of waves generated in the crystalline substrate are fundamentally determined by crystal structure. The SAW generated in the crystalline substrates travel through the substrate at rates of about 3600 meters per second; SSBAW, 6000 meters per second; and bulk acoustic waves, 7800 meters per second. An application of this invention lies in the generation of SAW and B-G waves in bulk crystals, which can only be generated in certain crystal structures (e.g., mm2 crystal symmetry common to z-cut MTiOXO$_4$). SAW can be generated directly on a z-cut MTiOXO$_4$ substrate without any ionic dopants such as rubidium. B-G waves can also be generated on x or y cut substrate with propagation along z axis. There are several advantages of using MTiOXO4 for generating B-G waves. First, since they are bulk acoustic waves, the bulk coupling coefficient (which is a material index of how efficient the material can convert the electrical energy into acoustic energy) of B-G waves can be very high (roughly about 20%, or about forty times the surface coupling coefficient of quartz), see D. K. T. Chu, Ph.D. dissertation, pages 57–64, Department of Electrical Engineering, University of Delaware (1991). Also as reported in this dissertation, the velocity is very high (reportedly about 4100 m/sec). A further application of this invention lies in the use of crystals having alternating domains, because, within a given IDT design, the frequency of the fundamental acoustic wave is doubled and can thus be made sufficiently high to allow for control of microwave frequencies, such as those used in high definition television and radar.

Interdigital transducers can be deposited on the surface of the crystalline substrate by conventional lithographic techniques, such as those described by H. I. Smith, Acoustic Surface Waves, Fabrication Techniques for Surface Wave Devices, pages 305–324, Springer-Verlag, Berlin Heidelberg, New York (1978). To develop the desired pattern onto MTiOXO$_4$ substrate one may use the following steps: (1) prepare the MTiOXO$_4$ substrate (usually z-cut for SAWs or x- or y-cut for B-G waves); (2) polish the substrate to provide a flatness better than half wavelength (typically about 0.3 µm flatness variation); (3) evaporate a conductive material, typically a metal film such as titanium about 1000 Å thick, onto the crystalline substrate using an electron beam evaporator; (4) spin a positive photoresist (e.g., a photopolymer) onto the substrate and softbake (prebake) at a suitable temperature and time period for the photoresist used; (5) align a predesigned photomask and expose it to light for a time sufficient to develop the desired resolution; (6) hardbake (postbake) for a suitable time and temperature for the photoresist used; (7) develop the exposed photoresist using a suitable developer; (8) etch the titanium off the area which has no photoresist cover; and (9) strip off unexposed photoresist using specified stripper (e.g., acetone). After all these processing steps, one can use a commercially available network analyzer such as Hewlett-Packard 8753C to analyze the performance of the devices. The pattern chosen for the IDT determines how the frequency is controlled. The operating frequency of an acoustic wave device is determined by the following equation:

$$f = v / \lambda$$

where v is the velocity of the acoustic wave generated in the device by the IDT and λ is the wavelength of the acoustic wave generated in the device by the IDT. Conventionally, the wavelength of the acoustic wave is determined by the IDT pattern. The smaller the width of the IDT "finger" in the direction of wave propagation, the smaller the wavelength of the acoustic wave generated in the device by the IDT, or the higher the operating frequency. However, there is a practical limit as to how small one can make the width of the IDT fingers due to the diffraction-free limit of the exposing sources such as UV light, electronic beam or X-ray. Consequently, a feature of this invention lies in the discovery that the use of a domain reversed crystalline material combined with proper application of IDTs can effectively double the acoustic wave frequency for a given "finger" width of IDT without having to reduce the periodicity of IDT in half as the conventional technique required. This is discussed further herein below in reference to the drawings.

The device of this invention using a substrate described herein, in combination with an input IDT, may be used to control high frequency optic waves by generating acoustic waves in the substrate while the substrate is optically employed (e.g., while laser-generated waves are passed through the substrate for wavelength conversion). For such use, the device may further comprise a source of laser waves (e.g., a laser). Alternatively, a second IDT may be used to detect the acoustic waves generated in the substrate for the purpose of controlling high frequency electric waves. The IDTs used as the receiving area and, as applicable, the sending area of the substrate surface are suitable for connection to an electric signal source and an electric signal responsive device, respectively. The devices for controlling high frequency signals of this invention may, optionally include connectors to facilitate connection of the device to an electric signal source and/or an electric signal responsive device.

The connections used between the interdigital transducers and either the high frequency signal or the signal responsive device are typically conventional conductive materials such as metal wires. For research purposes, a microwave probe head (Cascade Microtech SN17307, Cascade Microtech Inc., P.O. Box 1589, Beaverton, Oreg. 97057-1589) can be used instead of wires to receive electrical signals generated from a network analyzer and then input the signals to the first IDT to excite acoustic waves; and another probe head can be used on the signal end of the substrate surface to direct acoustic waves to receive the output to the network analyzer to analyze the transmission properties of the device.

FIG. 1 is a schematic illustration of a device (10) for frequency control in accordance with this invention. The device (10) is shown connected between a source at electric signal (12) and an electric signal responsive device (14). The frequency control device (10) includes a crystalline substrate of MTiOXO$_4$ (16) which has a surface (18) with a receiving end IDT (20) and a sending end IDT (22) deposited thereon. A connector (24) comprising lines (25) and (26) connects input IDT (20) to the signal source (12); and a connector (28) comprising lines (29) and (30) connects IDT (22) to the responding device (14). In operation, an electric signal from source (12) is transmitted through connector (24) to IDT (20) where acoustic waves (e.g., SAWs or B-G waves) are generated. The acoustic waves propagate through substrate (16) and are piezoelectrically detected by IDT (22). The electric signal produced at IDT (22) is transmitted through connector (28) to the responding device (14). In practice, the signal source (12) and the responding device (14) are normally included within a single unit (32).

Figure 2:
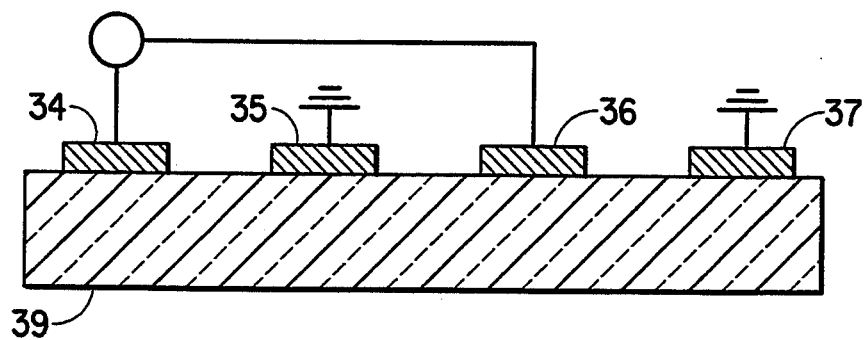
FIG. 2 is a schematic cross-sectional drawing through an IDT and substrate of a frequency controlling device utilizing a bulk crystalline substrate.

FIG. 2 is a cross-section view through the fingers (34), (35), (36) and (37) of an input IDT such as IDT (20) in FIG. 1 and the portion of a bulk crystalline substrate of MTiOXO$_4$ (39) upon which it is deposited. Fingers (34) and (36) are charged while fingers (35) and (38) are grounded. For the purpose of comparative analysis with FIG. 3, the distance between adjacent fingers is equal to the width, d, of each of the fingers. It is evident that the direction of the electric field in the substrate between fingers (34) and (35) and between fingers (36) and (37) is opposite in direction to the electric field in the substrate between fingers (35) and (36). Accordingly, the acoustic wavelength of the fundamental acoustic SAW or B-G wave generated by the IDT is equal to four times the finger width (i.e., 4d).

Figure 3:
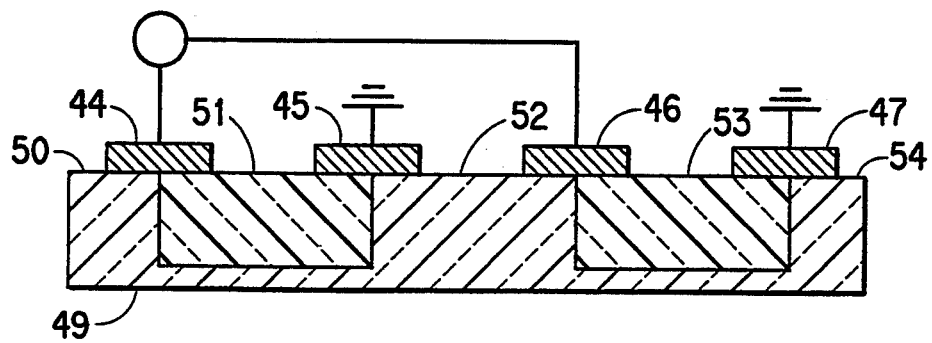
FIG. 3 is a schematic cross-sectional drawing through and IDT and substrate of a frequency controlling device utilizing an alternating domain substrate.

FIG. 3 is a cross-section view through the fingers (44), (45), (46) and (47) of an input IDT such as IDT (20) in FIG. 1 and a portion of a crystalline substrate (49) upon which it is deposited. The surface of the crystalline substrate in FIG. 3 includes an area having sections (51) and (53) of material where the ferroelectric domain has been reversed which alternate with sections (50), (52), and (54) of material where the domain has not been reversed. Fingers (44) and (46) are charged while fingers (45) and (47) are grounded. For the purpose of comparative analysis with FIG. 2, the distance between adjacent fingers and the width of each finger is equal to d, the width of the domain reversed sections is also equal to d, and the fingers are centered over the interfaces between the alternating sections. It is evident that because the ferroelectric domain between fingers (44) and (45) and fingers (46) and (47) is reversed compared to the domain between fingers (45) and (46), the electric field in the substrate between fingers (45) and (46) is in the same direction as the electric field in the substrate between fingers (44) and (45) and between fingers (46) and (47). Accordingly, the wavelength of the wavelength of the fundamental acoustic wave generated by the IDT is equal to two times the finger width (i.e., 2d). In other words the frequency of waves generated by the IDT in FIG. 3 is doubled when compared to use of the same type of IDT as in FIG. 2.

Figure 4:
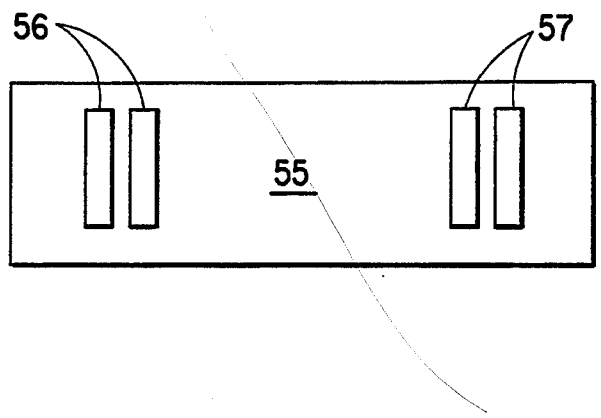
FIG. 4 is a schematic plan view of a substrate surface having sections of alternating domain.

FIG. 4 illustrates a substrate surface (55) having domain reversed sections (56) at a receiving area (prior to deposit of an IDT) and domain reversed sections (57) at a sending area (prior to deposit of an IDT).

It is important that the mask for the domain reversal regions is carefully designed. It is critical to have the mask designed in a way that the areas under IDT fingers have alternating domain structure so that the electric field under IDT fingers repeats. Domain reversal in the substrate portion between the receiving area IDT and the sending area IDT of the crystal surface is preferably avoided.

Practice of the invention is further illustrated by the following non-limiting examples.

EXAMPLES

Example 1

Figure 5A:
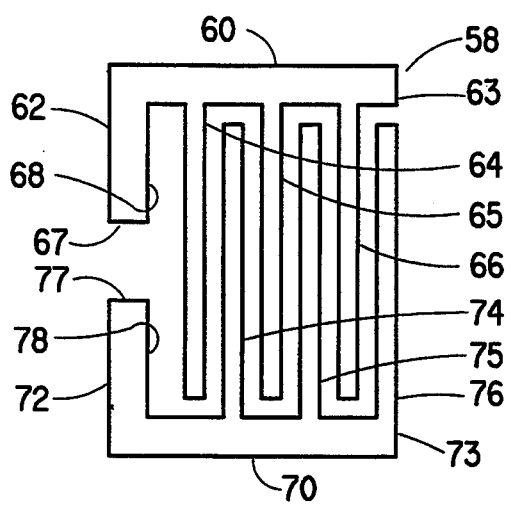
FIGS. 5a and 5b are schematic drawings of an IDT configuration including a signal receiving end IDT and a signal sending end IDT.

This example illustrates the generation of SAWs on a flux-grown z-cut KTP crystal. A photomask was made to provide an IDT to receive an electric signal in accordance with the design shown (not to scale) at (58) in FIG. 5(a). The input IDT (58) had an electrode (60) with a side portion (62), a top portion (63) and three fingers (64), (65) and (66) suitable for charging with a radio frequency electric signal; and an electrode (70) with a side port ion (72), a bottom port ion (73) and three fingers (74), (75) and (76) suitable for grounding. Each of the fingers (64), (65), (66), (74), (75), and (76) was about 4 μm wide (and about 3000 μm long) and the gap between adjacent fingers (e.g., between fingers (64) and (74)) was about 4 μm so as to generate an acoustic wave having a wavelength of about 16 μm. The separation between bottom edge (67) of the side portion (62) of electrode (60) and the top edge (77) of the side portion (72) of electrode (70) was about 100 μm; the separation between the inner edge (68) of the side portion (62) and the nearest finger (64), and the separation between the inner edge (78) of the side portion (72) and the nearest finger (64) were each about 100 μm; and the gaps between the fingers (64), (65) and (66) and the bottom portion (73) as well as the gaps between the fingers (74), (75) and (76) and the top portion (63) were each about 10 μm.

Figure 5B:
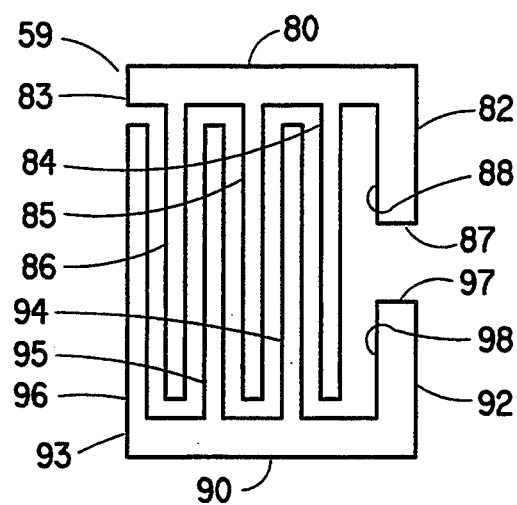
Figure 6:
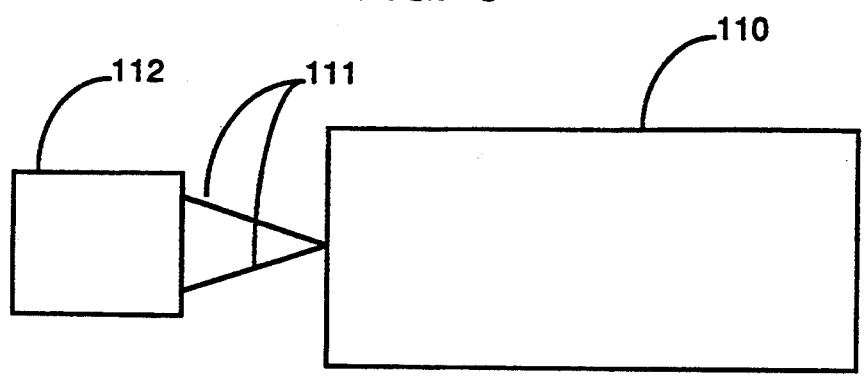
FIG. 6 schematically illustrates the use of a laser (112) as a source of high frequency optic waves (111) to a substrate having an input IDT deposited thereon (110).

The photomask was also made to provide a signal detecting IDT in accordance with the design shown (not to scale) at (59) in FIG. 5(b). The detecting IDT (59) had an electrode (80) with a side portion (82), a top portion (83), and three fingers (84), (85) and (86); and an electrode (90) with a side portion (92), a bottom portion (93), and three fingers (94), (95) and (96). Each of the fingers (84), (85), (86), (94), (95) and (96) was about 4 μm wide, about 3000 μm long, and the gap between adjacent fingers (e.g., between fingers (84) and (94)) was about 4 μm. The separation between bottom edge (87) of the side portion (82) and the top edge (97) of the side portion (92) was about 100 μm; the separation between the inner edge (88) of side portion (82) and the nearest finger (84) and the separation between the inner edge (98) of side portion (92) and the nearest finger (84) were each about 100 μm; and the gaps between the fingers (84), (85) and (86) and the bottom portion (93) as well as the gaps between the fingers (94), (95) and (96) and the top portion (83) were all about 10 μm.

IDTs (58) and (59) were deposited on the flux-grown z-cut KTP crystal in a conventional manner using the mask. The distance between two IDTs (58) and (59) was about 3 millimeters. An input signal of about 1 millivolt was used to generate acoustic waves using a commercially available network analyzer. The transmission data for the device was monitored using the network analyzer, and showed a large transmission peak center at 252 MHz. Since the wavelength is 16 μm and the frequency is 252 MHz, the velocity of this mode (acoustic waves) is calculated as about 4000 m/sec (using the relationship that the velocity is the product of the frequency and wavelength). This experimental data (i.e., a velocity of about 4000 m/sec) agrees with the theoretically calculated value using the program developed by Professor E. L. Adler, McGill University, IEEE Transactions on Ultrasonics, Ferroelectrics, and Frequency Control, Volume 37, No. 6, 485–490 (November 1990). The transmission data also showed that other modes of acoustic waves were generated simultaneously. One of them possessed higher speed than SAW indicated by a peak center at 360 MHz, possibly indicative of a kind of bulk acoustic wave. This example clearly demonstrates that untreated bulk $MTiOXO_4$ crystals are capable of SAW generation without the need of ionic dopants such Rb, and SAW waves even possess higher

Example 2

A y-cut flux-grown KTP was used to generate acoustic waves with about 16 μm wavelength by using the same photomask as in Example 1. The transmission data of this device showed a major transmission peak center at 255 MHz. The corresponding acoustic waves had a velocity of about 4100 m/sec which is very close to the predicted value of Bleustein-Gulyaev waves according to the data disclosed by D. K. T. Chu, Ph.D. dissertation, pages 57–64, Department of Electrical Engineering, University of Delaware (1991). This example proves that $MTiOXO_4$ crystals have the ability to generate the B-G waves as predicted.

Example 3

This prophetic example illustrates the generation SAW having one-half the wavelength (i.e., twice the frequency) of the SAW generated in Example 1 by utilizing a hydrothermally-grown z-cut KTP crystal having domains reversed under the IDT. The selectively domain reversed hydrothermally-grown z-cut KTP crystal is prepared by Rb ion exchange in accordance with Example 1 of European Patent Application Publication No. 0 454 071 A2. In accordance with this teaching, a hydrothermally-grown z-cut KTP crystal is coated with about 1000 Å of Ti by thermal evaporation. A photoresist is then contact exposed through a photomask containing a pattern identical in period to the IDT, which will be later applied. The exposed photoresist is removed and the Ti coating revealed beneath the removed photoresist is chemically etched using a solution of ethylene diamine tetraacetic acid (EDTA), $H_2O_2$ and $NH_4OH$ so that the KTP substrate is selectively revealed. The remaining photoresist is then removed and the Ti-masked substrate is end polished and ion exchanged in a molten salt bath consisting of 1 mole % $Ba(NO_3)_2$, 95 mole % $RbNO_3$ and 4 mole % $TlNO_3$, at a temperature of 360° C. for an exchange time of 1 hr. The ion exchanged KTP substrate is cooled to room temperature and the Ti mask removed.

IDT's of the type described in Example 1 herein above, are applied to the ion exchanged portions of the KTP substrate. Transmission data of the resulting device shows a large transmission peak centers at about 504 MHz. Since the wavelength is 8 μm and the frequency is 504 MHz, the velocity of this mode (acoustic waves) is calculated as about 4000 m/sec (using the relationship that velocity is equal to the product of the frequency and wavelength). This illustrates that one obtains double the frequency for the same IDT design as used in Example 1 by using domain reversal on the area of the KTP substrate to which the input IDT is applied.

Particular embodiments of the invention are included in the examples. Other embodiments will become apparent to those skilled in the art from a consideration of the specification or practice of the invention disclosed herein. It is understood that modifications and variations may be practical without departing from the spirit and scope of the novel concepts of this invention. It is further understood that the invention is not confined to the particular formulations and examples herein illustrated, but it embraces such modified forms thereof as come within the scope of the following claims.

What is claimed is:

1. A device for controlling high frequency signals by generation of Bleustein-Gulyaev acoustic waves, comprising:
   (a) an x-cut or y-cut bulk crystalline substrate of $MTiOXO_4$, wherein M is selected from the group consisting of K, Rb, Tl and $NH_4$ and mixtures thereof and X is selected from the group consisting of P and As and mixtures thereof, wherein the crystalline substrate of $MTiOXO_4$ has mm2 crystal symmetry and a surface with a receiving area; and
   (b) an input interdigital transducer deposited on the signal receiving area of said substrate surface, suitable for connection to a source of electric signal and for inverse piezoelectrically generating Bleustein-Gulyaev acoustic waves in the crystalline substrate.

2. A device in accordance with claim 1 for controlling high frequency optic signals wherein said device further comprises a laser as a source of optic waves to the substrate.

3. A device in accordance with claim 1 for controlling high frequency electric signals wherein said substrate surface has a sending area, and wherein said device further comprises a second interdigital transducer deposited on the signal sending area of said substrate surface suitable for piezoelectrically detecting said acoustic waves, and for connection to an electric signal responsive device.

4. A device in accordance with claim 2 wherein the substrate is bulk $KTiOPO_4$.

5. A device for controlling high frequency signals by the generation of acoustic waves, comprising:
   (a) a crystalline substrate having a piezoelectric-elastic dielectric matrix capable of the generation of acoustic waves and a surface with a receiving area having alternating sections of crystalline material which are aligned and have a ferroelectric domain structure opposite to that of adjacent sections; and
   (b) an input interdigital transducer deposited on the signal receiving area of said substrate surface in contact with the area of alternating sections of crystalline material at the receiving area, and suitable for connection to a source of signal and for inverse piezoelectrically generating acoustic waves in the crystalline substrate.

6. A device in accordance with claim 5, for controlling high frequency optic signals wherein said device further comprises a laser as a source of optic waves to the substrate.

7. A device in accordance with claim 5 for controlling high frequency electric signals wherein said substrate has a sending area having alternating sections of crystalline material which are aligned and have a ferroelectric domain structure opposite to that of adjacent sections; and wherein the device further comprises a second interdigital transducer deposited on the signal sending area of said substrate surface in contact with the alternating sections of crystalline material at the sending area and suitable for piezoelectrically detecting said acoustic waves and for connection to an electric signal responsive device.

8. A device in accordance with claim 7 wherein the crystalline substrate is a substrate of $MTiOXO_4$ and said alternating sections are periodically domain reversed $MTiOXO_4$ wherein M is selected from the group consisting of K, Rb, Tl, $NH_4$ and mixture thereof and X is selected from the group consisting of P, As and mixtures thereof.

9. A device in accordance with claim 5, claim 6, claim 7, or claim 8 wherein said alternating sections are alternating sections of $KTiOPO_4$ and $KTiOPO_4$ which is periodically exchanged using $Rb^+$ and $Tl^+$ together with $Ba^{++}$.

10. A device in accordance with claim 5, claim 6, claim 7, or claim 8 wherein the crystalline substrate is periodically domain reversed lithium niobate.

* * * * *